United States Patent

Lean et al.

[15] 3,648,081

[45] Mar. 7, 1972

[54] PIEZOELECTRIC ACOUSTIC SURFACE WAVE DEVICE UTILIZING AN AMORPHOUS SEMICONDUCTIVE SENSING MATERIAL

[72] Inventors: Eric G. Lean, Mahopac; Varadachari Sadagopan; Samuel C.-C. Tseng, both of Ossining, all of N.Y.

[73] Assignee: International Business Machines Corporation, Armonk, N.Y.

[22] Filed: June 30, 1970

[21] Appl. No.: 51,187

[52] U.S. Cl. ............................310/8.1, 310/9.8, 317/234 R, 333/30 R, 330/5.5

[51] Int. Cl. ............................H01v 7/00

[58] Field of Search............................310/8, 8.1, 8.2, 8.3, 9.8; 317/235, 234 R; 333/30, 72; 340/173, 173.2; 330/5.5

[56] References Cited

UNITED STATES PATENTS

| | | | |
|---|---|---|---|
| 3,479,572 | 11/1969 | Pokorny | 317/235 |
| 3,212,072 | 10/1965 | Fuller | 333/30 X |
| 3,202,824 | 8/1965 | Yando | 333/30 X |
| 3,243,648 | 3/1966 | Yando | 310/8.1 X |
| 3,446,975 | 5/1969 | Adler et al. | 310/8.1 X |
| 3,460,005 | 8/1969 | Kanda et al. | 310/8.1 UX |
| 3,448,437 | 6/1969 | Barnett | 310/8.1 X |

*Primary Examiner*—D. F. Duggan
*Assistant Examiner*—Mark O. Budd
*Attorney*—Hanifin and Jancin and Bernard N. Wiener

[57] ABSTRACT

An integrated acoustic surface wave device is provided by this disclosure wherein a piezoelectric field associated with an acoustic surface wave causes a material adjacent to the surface to transform from one physical state to another physical state. The changes in state due to the presence of the piezoelectric wave are utilized to detect, amplify and store information. The presence of the piezoelectric wave controls external physical quantities, e.g., voltage and current, for information processing and storage. In particular, an amorphous semiconducting material is deposited on the surface of a piezoelectric surface wave acoustic delay line at a location where the presence of the traversing piezoelectric wave is to be detected. Contact electrodes are provided on the amorphous material and are connected to an external electrical circuit wherein there is a voltage source and a load means. The voltage source provides an electric field in the amorphous material of a value below that necessary to achieve the threshold value for switching the material from a high-voltage and low-current state to a high-current and low-voltage state. In this manner, the piezoelectric field of the acoustic surface wave which transiently appears at the amorphous material when added to the externally applied electric field causes it to switch states and thereby gives rise to a pulse indication in the external electrical circuit.

Accordingly, an integrated apparatus in accordance with this disclosure includes a piezoelectric surface wave delay line and an amorphous semiconductor film. A transducer on the surface of the piezoelectric crystal generates piezoelectric surface waves therein, and a local receiving transducer which serves as the electrodes for the amorphous semiconductor film intercepts the piezoelectric surface wave. The electric field associated with the surface wave supplements a bias electric field at the amorphous semiconductor film and causes the states thereof to switch and provides an indication of the presence of the piezoelectric wave in the external electric circuit connected to the amorphous film.

16 Claims, 8 Drawing Figures

INVENTORS
ERIC G. LEAN
VARADACHARI SADAGOPAN
SAMUEL C.-C. TSENG

BY
Bernard N. Wiener
ATTORNEY

PIEZOELECTRIC ACOUSTIC SURFACE WAVE DEVICE UTILIZING AN AMORPHOUS SEMICONDUCTIVE SENSING MATERIAL

BACKGROUND OF THE INVENTION

Heretofore, bulk acoustic waves propagating in an acoustic wave column have been used to switch the magnetization of thin magnetic films having uniaxial anisotropy. The film is switched by the strain in the film generated by the stress imparted thereto by the acoustic wave. An illustrative background reference for this technology is "Sonic Film Memory," by H. Weinstein et al., RCA Review, Vol. 28, Page 317, June 1967.

An amorphous semiconductor film is known to have a threshold for switching and memory due to the application of an electric field. The film changes from a high resistance insulator state to a low resistance conductive state when a voltage exceeding a certain threshold value is applied to the film. Illustrative changes in resistance are known in the prior art of the order of $10^8$. The high resistance state returns once the total electric field voltage falls below another threshold value. An illustrative switching speed is 150 pico-seconds for a threshold electric field intensity of approximately $10^4$ to $10^6$ volts/cm. Illustrative background literature references concerning such amorphous semiconductor materials, now commonly termed ovonic materials, are the following:

1. Book: Proceedings of the First Conference on "Semiconductor Effects in Amorphous Solids," New York, N.Y., May, 1969, North-Holland Publishing Company, Amsterdam 1970, also published as special supplement of the Journal of Noncrystalline Solids, 2, 1970.
2. Book: Proceedings of the Conference on "Amorphous and Liquid Semiconductors," especially pages 510, 518, 523, 538, 573. Cambridge, England, Sept. 1969, North-Holland Publishing Company, Amsterdam, 1970, also published as special supplement of the Journal of Noncrystalline Solids, 2, Apr. 1970.
3. Article: "Applications of Amorphous Semiconductors in Electronic Devices," J. G. Simmons, Contemporary Physics 11, pages 21–41, 1970.
4. "Conduction and Switching Phenomena in Covalent Alloy Semiconductors," H. Fritzsche et al., Journal of Noncrystalline Solids, 4, page 464, 1970.
5. "Nonohmic Properties of Some Amorphous Semiconductors," N. Croitrou et al., Journal of Noncrystalline Solids, 4, page 493, 1970.

Piezoelectric surface wave device technology has been investigated considerably in the prior art. In a device of this type, an input transducer launches an acoustic wave in the device which propagates along a surface of the crystalline body of the device. There is a detectable piezoelectric field associated with the acoustic wave. Illustrative background literature references concerning piezoelectric surface wave devices are the following:

1. "The Generation and Propagation of Acoustic Surface Waves at Microwave Frequencies," P. H. Carr, IEEE Transactions on Microwave Theory and Techniques, Vol. MTT-17, No. 11, Nov. 1969, pages 845–855.
2. "Direct Piezoelectric Coupling to Surface Elastic Waves," R. M. White et al., Applied Physics Letters, Vol. 7, pages 314–316, Dec., 1965.
3. "Propagation of Piezoelectric and Elastic Surface Waves on The Basal Plane of Hexagonal Piezoelectric Crystals," C.-C. Tseng et al., Journal of Applied Physics, Vol. 38, pages 4274–4280, Oct. 1967.

OBJECTS OF THE INVENTION

It is an object of this invention to provide an acoustic delay line device in which an acoustic surface wave causes a transformation in a localized region adjacent to the acoustic delay line to cause an external circuit to provide an indication of the passage of the surface wave.

It is another object of this invention to provide an integrated device wherein a piezoelectric surface wave causes a material proximate thereto to manifest transiently an indication of the presence of an acoustic surface wave as a consequence of a change in physical state of the material.

It is another object of this invention to provide an acoustic delay line device wherein a piezoelectric field associated with an acoustic surface wave causes a material established in a localized region of the surface to detect transiently the presence of the piezoelectric field.

It is another object of this invention to provide an electric pulse scanner with delay property wherein an acoustic surface wave device is tapped locally in accordance with the time passage of the surface wave.

It is another object of this invention to provide an acoustic surface wave device for detecting, amplifying and storing of information.

SUMMARY OF THE INVENTION

The practice of this invention utilizes the piezoelectric field associated with an acoustic s$rface wave to obtain an indication of its transient presence at a given location in a piezoelectric device. The piezoelectric field associated with the acoustic surface wave causes a suitable material adjacent to the surface of the device to transform from one physical state to another physical state. An externally applied bias electric field is applied to the adjacent material such that taken together with the piezoelectric field there is achieved a threshold value for switching states. External circuitry communicates with the adjacent material to detect the change of state which occurs therein during passage of the piezoelectric wave.

In particular, a local region of an amorphous semiconducting material is established proximate to an acoustic surface wave delay line device. Electrodes thereon provide a bias electric field from an external voltage source such that the transient electric field momentarily causes the total electric field in the amorphous material to be sufficient to transform the material from a high resistance state to a low resistance state thereby giving an indication of the transient presence of the acoustic wave.

An exemplary device configuration according to the principles of this invention consists of an acoustic surface wave delay line device with an interdigital surface acoustic wave transducer located thereon in the surface wave path together with an ovonic amorphous semiconductor film deposited directly on the transducer. The interdigital transducer serves as a transducer for surface acoustic waves and the electrodes thereof serve for applying the voltage bias to the ovonic film. The applied voltage is biased below the threshold value for switching of the ovonic film. The sum of the electric field associated with the applied voltage and the electric field associated with the piezoelectric surface wave is set to exceed the threshold value for switching of the ovonic film from the high resistance state to the low resistance state. Illustratively, the maximum available electric field associated with a piezoelectric surface wave is of the order of $10^5$ volt/cm. which is approximately one-third to one-tenth of the threshold electric field intensity required to switch a conventional ovonic material. The switching of states of the ovonic film by the coincidence of the applied voltage and the surface acoustic wave is detected by the change in the resistance of the film as monitored by an external circuit electrically connected thereto.

Among the advantages of the practice of this invention are the following:

a. Through use of passive components, sensitive identification of the transient piezoelectric wave is obtained locally on the piezoelectric crystal surface.

b. An integrated structure is readily and inexpensively fabricated.

c. Through use of a propagating wave, failure of a component at a sensing station of a scanner device does not impair operation of the rest of the device.

The foregoing and other objects, features and advantages of the invention will be apparent from the following more particular description of preferred embodiments of the invention, as illustrated in the accompanying drawings.

DETAILED DESCRIPTION OF THE DRAWINGS

PRIOR ART

Figure 1A:
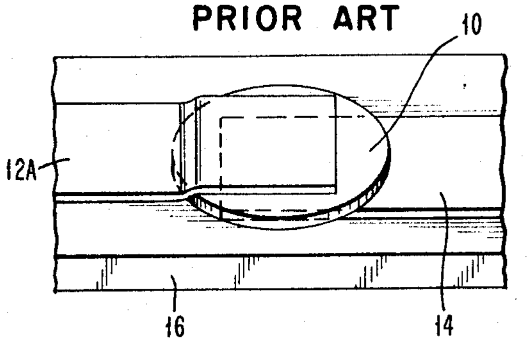
FIG. 1A PRIOR ART
FIGS. 1A and 1B are schematic illustrations of prior art electrode configurations for applying a voltage to an amorphous semiconductor material, e.g., ovonic material.
Figure 1B:
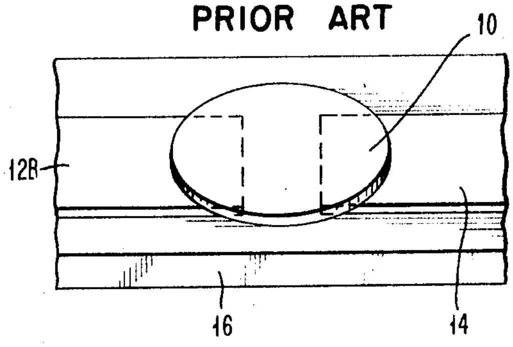
FIG. 1B PRIOR ART
Figure 1C:
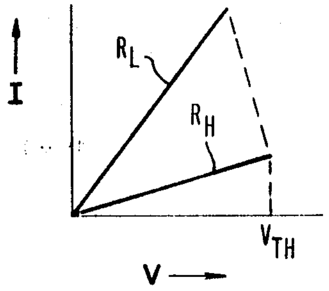
FIG. 1C PRIOR ART
FIG. 1C is a graphical illustration of the high and low resistance states of an amorphous semiconducting material according to the prior art indicating that the high resistance state has relatively high voltage and low current and that the low resistance state has relatively high current and low voltage.

A prior art amorphous semiconductor film, e.g., ovonic material, is shown in FIG. 1A as a layer 10 contacted by electrodes 12A and 14 adjacent the upper and lower surfaces thereof, respectively. Electrodes 12A and 14 are supported by substrate 16. An alternative arrangement in the prior art practice is shown in FIG. 1B with electrodes 12B and 14 both adjacent to the upper surface of substrate 16 with the layer 10 of ovonic material being deposited therebetween with overlapped segments. The nature of the resistance curves for a conventional ovonic material is illustrated in FIG. 1C wherein the linear low resistance state load line $R_L$ and the high resistance state load line $R_H$ are shown. For this conventional ovonic material, when the voltage exceeds a threshold value on the high resistance state line $R_H$, the material changes physical state and the load line transforms to the low resistance state indicated by $R_L$.

Ovonic films are normally amorphous chalcogenide semiconductors. A typical composition contains As, Ge, Si and Te. Generally, such materials have both switching and memory properties when subjected to an appropriate electric field value. The films which act only as switches are called ovonic threshold switches and those with memory are called ovonic memory switches.

Some of the general features of switching in ovonic devices are summarized as follows:

1. Switching may be observed whenever one of the parameters, voltage, pulse, lengths, repetition rate and temperature is varied, keeping all others constant.
2. Switching time is dependent on the magnitude of the applied voltage.
3. The switching time includes the delay time and the actual time taken to switch.
4. The delay time has been found to increase with sample thickness. Actual switching time has been described in the prior art literature as 150 picoseconds, whereas the delay time has been described as 100 nanoseconds.
5. The delay time has been considered to depend on the voltage V according to the following relation:
   $$t_d=k_1\exp(-V/k_2),$$
   where $k_1$, $k_2$ are constants and $t_d$ is the time interval between pulse begin and current breakthrough.
6. Delay time may be significantly decreased by using a bias voltage pulse, as noted by R. R. Shanks in the Journal of Noncrystalline Solids, 2, page 514, 1970.

PREFERRED EMBODIMENT OF INVENTION

Figure 2:
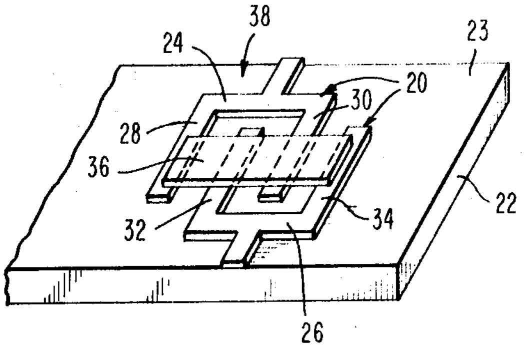
FIG. 2 is a schematic illustration of an interdigital transducer upon which a layer of amorphous semiconducting material is established for the practice of this invention.
Figure 3:
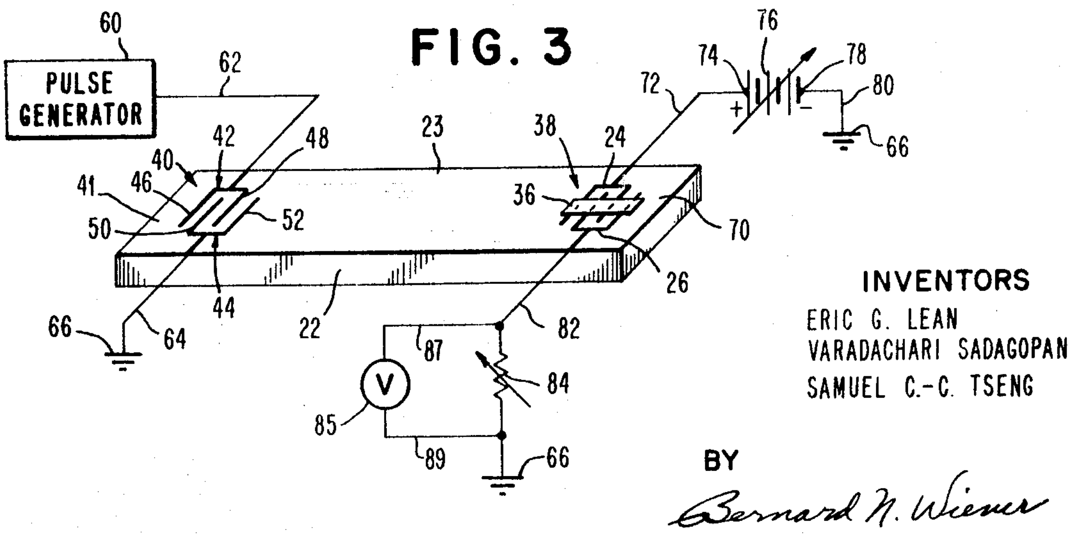
FIG. 3 is a schematic illustration of an acoustic surface wave delay line device in accordance with the principles of this invention whose output is taken via a transformational arrangement for utilizing the piezoelectric field associated with the wave to transform the state of an adjacent region of amorphous material to obtain an indication of the arrival of the piezoelectric wave.

The description of the preferred embodiment of this invention presented herein will be initiated with reference to FIGS. 2 and 3 wherein FIG. 2 is s schematic perspective view of a portion of a delay line in accordance with the practice of this invention wherein an interdigital transducer 20 is established on a section of piezoelectric delay line 22. Interdigital transducer 20 comprises upper segment 24 and lower segment 26 deposited by evaporation and masking technique on the upper surface of piezoelectric crystal 22. Upper portion 24 of interdigital transducer 20 comprises extensions 28 and 30 and lower portion 26 thereof comprises extensions 32 and 34 which are interleaved with the extensions 28 and 30 of upper portion 24. The pitch of the interdigital electrodes 28, 32, 30 and 34, i.e., the distance between adjacent electrodes, is designed to be equal to one-half the wavelength of the piezoelectric surface waves propagated on the surface 23 of piezoelectric delay line 22. The piezoelectric surface wave is a radiofrequency pulse. If the piezoelectric surface wave is a video pulse, the pitch, i.e., distance between the electrodes, is designed to be equal to the pulse time width multiplied by the velocity of the piezoelectric surface wave. An amorphous semiconductor film 36 useful for the practice of this invention for transformation of the transient electric field of the piezoelectric surface wave to an external indication is deposited on the interdigital electrode structure 20 so as to span it from extension 38 to extension 34 to provide interdigital configuration 38. The configuration for the electrodes 24 and 26 shown in FIG. 2 is an efficient transducer for the piezoelectric surface waves.

The exemplary preferred embodiment of this invention is illustrated in FIG. 3 which shows a linear piezoelectric surface wave delay line 22 with input transducer 40 established at the left and input end 41 thereof and output interdigital transducer configuration 38 established at the right and output end 70 thereof. Transducer 40 comprises an interdigital structure comparable to the interdigital structure 20 of FIG. 2 and may, for example, be deposited by the same masking technique as used for interdigital transducer 20. Input transducer 40 comprises upper portion 42 and lower portion 44 with pairs of electrodes 46 and 48 and 50 and 52, respectively, which are located relative to each other in interdigital fashion, and spaced according to the spacing used for output transducer configuration 38. Input transducer 40 is energized by pulse generator 60. Illustratively, pulse generator 60 may be either a radiofrequency pulse generator or a video pulse generator dependent on the nature of the spacing of the electrodes of interdigital transducer 40. For a radiofrequency pulse, transducer 40 is designed to have the spacing between the sequential electrodes equal to one-half the wavelength of the piezoelectric surface wave; and for a generator of video pulses, the distance between the electrodes is made equal to the pulse time width multiplied by the velocity of the piezoelectric surface wave. The input section of the delay line apparatus of FIG. 3 is conventional in the prior art and the illustrative background references concerning piezoelectric surface wave devices presented hereinbefore in the section entitled Background of the Invention are useful for the practice of this invention. Illustratively, piezoelectric crystal 22 in $LiNbO_3$ (lithium niobate) and surface 23 thereof is a polished surface of the crystal. Upper electrodes 46 and 48 are connected via connection 62 to generator 60 and lower electrodes 50 and 52 are connected via connection 64 to ground 66.

The transformation configuration 38 comprising interdigital electrodes 20 and amorphous layer 36 is located at the output end 70 of piezoelectric crystal 22 on the surface 23. Amorphous film 36 having the I-V switching characteristic illustrated in FIG. 1C is selectively established in the path of the piezoelectric surface wave to enhance the transformation indication of the transient presence of the piezoelectric field. Upper electrode configuration 24 is connected via conductor 72 to positive terminal 74 of voltage source 76, e.g., a battery. Negative terminal 78 is connected via conductor 80 to ground 66. Lower electrode structure 26 is connected via conductor 82 and load resistance 84 to ground 66.

Voltage source 76 is set to bias interdigital configuration 38 at voltage slightly but stably below the threshold voltage $V_{TH}$ (FIG. 1C). This adjustment may be made either through calculation of the amplitude of the piezoelectric surface wave at the location of the interdigital configuration 38 or may be established experimentally by adjusting the value of voltage source 76 during the propagation of pulses from generator 60. The film 36 is normally in the high resistance state $R_H$ (FIG. 1C) in the absence of piezoelectric surface waves propagating at the location of interdigital electrode structure 20. An exemplary electric field for the piezoelectric surface wave may be approximately $10^5$ volt/cm. in a piezoelectric material 22 such as poled lead titanate zirconate ceramics and $LiNbO_3$ (lithium niobate) crystals. Since the pitch of the adjacent electrodes of transducer 20, i.e., the distance therebetween, is designed for maximum pickup of the transient electric field of the piezoelectric surface wave, the maximum strength thereof will appear across adjacent pairs of the interdigital electrodes. Therefore, the bias electric field and the transient piezoelectric field are added linearly at output configuration 38 to effect switching of the state of amorphous layer 36 from the high resistance branch $R_H$ to the low resistance branch $R_L$ as shown in FIG. 1C. After the piezoelectric surface wave has propagated past the amorphous film 36, the high resistance state returns therein. Accordingly, a pulse voltage appears across load resistance 84 connected to interdigital structure 38 as the piezoelectric surface wave transiently passes the location of the amorphous layer 36.

An output indication of the transient piezoelectric surface wave is provided as a voltage by voltage sensitive device 85 connected across resistance 84 by connections 87 and 89. Since the energy delivered to the load resistor 84 is from the bias voltage source 76, the amplitude of the output signal may be made very large compared to the amplitude of the piezoelectric field. Accordingly, the embodiment of this invention illustrated in FIG. 2 and FIG. 3 is an efficient detector scheme for pulses provided by pulse generator 60.

Illustrative sequential steps in the fabrication of the output configuration 38 shown in FIG. 2 are as follows:

1. Cutting and polishing of piezoelectric substrate 22, such as lead titanate zirconate or lithium niobate.
2. Deposition of interdigital electrode structures 24 and 26, e.g., aluminum, through a combination of conventional evaporation and photolithographic techniques.
3. The resultant structure of Steps 1 and 2 is positioned in a radiofrequency sputtering unit anode assembly area and the amorphous semiconductor film 36 is deposited over the interdigital electrodes 28, 30, 32 and 34 through standard radiofrequency sputtering technique. During deposition, the piezoelectric substrate 22 is cooled, preferably a liquid nitrogen temperature of 77° K., to promote formation of a stable amorphous film 36. The sputtering parameters are chosen so that fast deposition rates are achieved which aids the formation of a film 36 with amorphous character and suitable switching characteristic.

PRACTICE OF THE INVENTION

Figure 4:
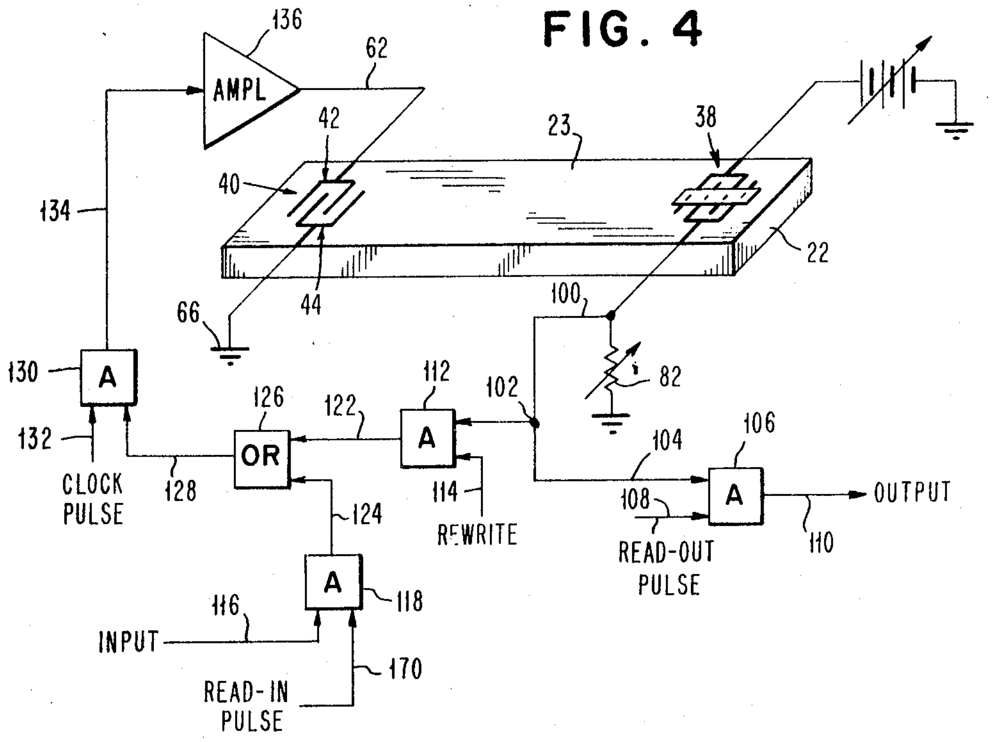
FIG. 4 shows a schematic illustration of an acoustic surface wave delay line device according to this invention wherein an external electrical circuit provides a feedback path for circulating the information content of the piezoelectric wave.
Figure 5:
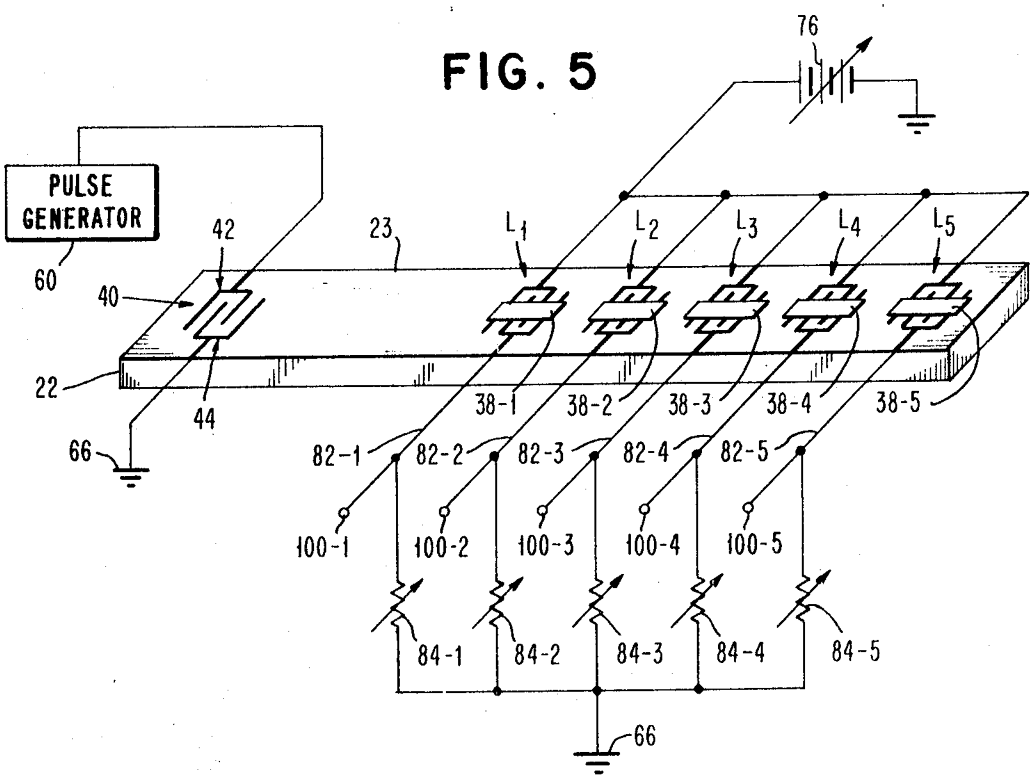
FIG. 5 presents schematic illustration of an embodiment of this invention for obtaining a sequence of pulses during the transient passage of a piezoelectric surface wave through the cooperative relationship of respective amorphous films adjacent to the surface of the piezoelectric crystal.
Figure 6:
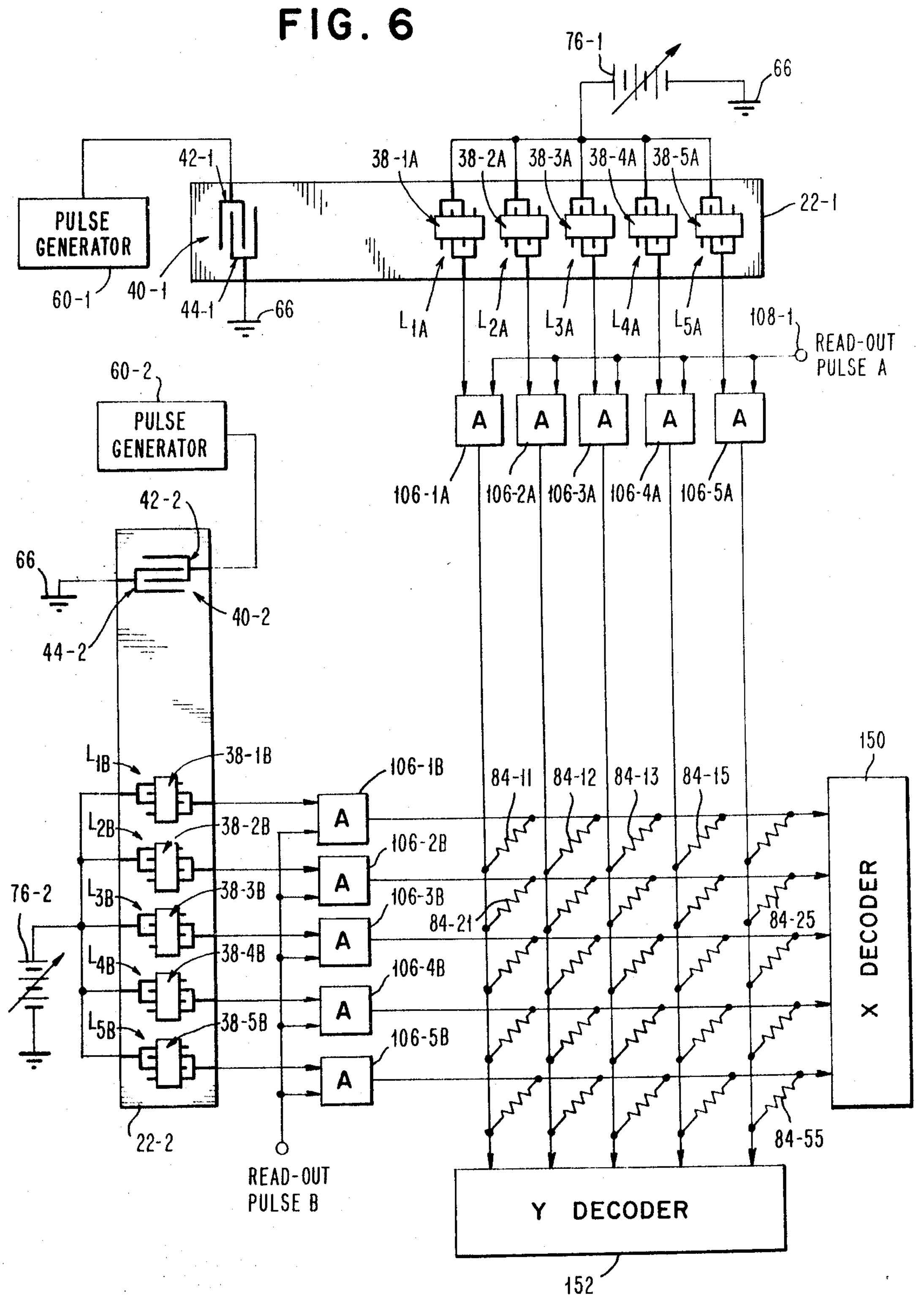
FIG. 6 presents a schematic illustration of the cooperative relationship of two pulse scanner devices according to FIG. 5 connected to provide a memory or display by coincidence technique according to this invention.

The extended practice of this invention will now be presented with reference to embodiments thereof presented in FIGS. 4 to 6. The basic structure of the preferred embodiment presented in FIG. 3 is utilized in each of these embodiments and common designating numerals are used where applicable. An embodiment of this invention for obtaining a memory feature is presented in FIG. 4; a pulse scanner arrangement is presented in FIG. 5; and a coincidence switch arrangement is presented in FIG. 6. Generally, the additional circuitry presented for the embodiments of FIGS. 4 to 6 is conventional except as it relates to the explicit use of the interdigital electrode structure 20 and amorphous film 36 shown in FIG. 2.

The feedback path between output transformation structure 38 and input interdigital transducer 40 for the memory embodiment of this invention shown in FIG. 4 includes connection 100 which is connected to load resistance 82 and to junction 102. Junction 102 is connected via conductor 104 to output AND-gate 106 which is operated by a read-out pulse applied to conductor 108 to provide an output indication on conductor 110. Junction 102 is also connected to one input of AND-gate 112 which is activated by a rewrite pulse on conductor 114. The recirculating memory operation is initiated by an input pulse on input line 116 connected to AND-gate 118 which is activated by a read-in pulse applied to conductor 170. The outputs of rewrite AND-gate 112 and read-in AND-gate 118 are communicated via conductors 122 and 124, respectively, to OR-gate 126. The output of OR-gate 126 is connected via conductor 128 to clock AND-gate 130 which is activated by a clock pulse applied to conductor 132. The output of clock AND-gate 130 is connected via conductor 134 to amplifier 136 which is connected via conductor 62 to interdigital electrode pair 42. In operation the embodiment of FIG. 4 of a recirculating memory requires a pulse timing pattern in accordance with conventional requirements. Illustratively, a conventional clock pulse circuit providing timing clock pulses is connected to AND-gate 130 and all other pulses i.e., input, read-in pulse, read-write pulse, and readout pulse are presented in timed relationship thereto. By the arrangement presented in FIG. 4, a stable recirculating memory delay line is obtained in which attenuation of the piezoelectric surface wave in piezoelectric crystal 22 is overcome by the amplification feature of the output circuit and the memory feature achieved by the feedback path between the output interdigital transformation configuration 38 and the input interdigital transducer 40.

The pulse scanner embodiment of this invention presented in FIG. 5 incorporates a series of sequentially located transformation configurations 38-1 to 38-5 established at sequential locations $L_1$ to $L_5$ on piezoelectric crystal surface 23. By providing a common voltage source 76 and independent output terminals 100-1 to 100-5, respectively, for load resistances 84-1 to 84-5 a series of timed pulses is obtained from the scanner embodiment of FIG. 5. The respective distributed pulse signal is delivered to the related output after a time interval which is equal to the distance between the adjacent transformation configurations divided by the velocity of the piezoelectric surface wave.

The embodiment of this invention presented in FIG. 6 provides for coincidence selection of a given load from a plurality of loads. Two device arrangements similar to the embodiment of FIG. 5 are cooperatively connected to each load, e.g., load resistance 84-11 is commonly shared by transformation configuration 38-1A and transducer arrangement 38-1B of the respective delay lines 22-1 and 22-2. If each load resistance 84-11, 84-12, ... 84-55, is inherently the load itself, e.g., a display lamp, the X decoder and Y decoder 150 and 152 are not required. However, if the load resistances 84-11, 84-12, ... 84-

55, are memory locations with stored information, the decoders are required to identify the stored information. Such decoders are conventional in the prior art and further details are not presented herein.

Connectors 108-1 and 108-2 are connected to AND-gates 106-1A ... 106-5A and to AND-gates 106-1B ... 106-5B, respectively. By initiating pulse generators 60-1 and 60-2 synchronously and establishing read-out pulses A and B on connectors 108-1 and 108-2, in accordance with the load resistance to be selected from the array in appropriate timing relationship, any one of the load resistances is conveniently selected by the coincident relationship of the transient presence of the piezoelectric waves in the appropriate pair of transformation configurations 38-1A, 38-2A, ... 38-5A and 38-1B, 38-2B, ... 38-5B to select any given load resistance. Illustratively, transformation configuration 36-5A and 36-2B select load resistance 84-255.

What is claimed is:

1. In a piezoelectric surface wave delay line including an input transducer means and an output transducer means for launching and receiving respectively a piezoelectric surface wave pulse in said delay line, the improvement comprising:

a layer of material adjacent to said output transducer in electric field communicating position therewith, said material having first and second physical states switchable by an applied threshold electric field from said first state to said second state manifestable by a change in a detectable physical property, and capability of retaining a bias electric field which taken together with said piezoelectric field is at least equal to said threshold electric field.

2. Device as set forth in claim 1 wherein said material is an amorphous semiconductor material.

3. Device as set forth in claim 2 wherein said amorphous semiconductor material is ovonic material.

4. Device as set forth in claim 1 including at least two sequentially located output transducers and respective layers of said material thereat wherein said sequential output transducers are spaced a distance equivalent to said pulse time width divided by the velocity of propagation of said surface wave in said device.

5. Piezoelectric surface wave structure comprising:

a piezoelectric surface wave propagation member;

an input transducer on said piezoelectric surface wave member for launching piezoelectric surface waves therein; and an output transducer configuration for providing an indication of the transient presence of a piezoelectric surface wave thereat including an electrode structure for intercepting the piezoelectric field of said piezoelectric surface wave, and a layer of material adjacent to said electrode structure for enveloping said piezoelectric surface wave to provide a change of state therein manifestable by a detectable change in a physical property of said material, and external circuitry connected to said electrode structure and said layer of material to provide an indication of the transient presence of sad piezoelectric surface wave at said transducer configuration.

6. Piezoelectric surface wave device comprising:

a piezoelectric surface wave propagation member;

an input transducer means on said piezoelectric surface wave member for launching piezoelectric surface waves therein including pulse source means for energizing said waves;

an output transducer configuration for providing an indication of the transient presence of a piezoelectric surface wave including an electrode structure for intercepting the piezoelectric field of said piezoelectric surface wave, a layer of material adjacent to said electrode structure for enveloping said piezoelectric surface wave to provide a change of state therein manifestable by a detectable change in a physical property of said material, and external circuitry connected to said electrode structure and said layer of material to provide an indication of the transient presence of said piezoelectric surface wave at said transducer configuration due to said change of state therein.

7. A device as set forth in claim 6 which includes bias voltage source means to establish a bias electric field in said layer of material.

8. Device as set forth in claim 6 wherein said input transducer and said output transducer are interdigital transducers.

9. Device as set forth in claim 6 wherein said layer of material proximate to said electrode structure is an amorphous semiconductor material having a high resistance state and a low resistance state.

10. Device as set forth in claim 9 wherein said amorphous semiconductor material is an ovonic material.

11. Device as set forth in claim 6 wherein said pulse source means provides radiofrequency pulses.

12. Device as set forth in claim 6 wherein said pulse source means provides video pulses.

13. Recirculating piezoelectric surface wave device comprising:

piezoelectric surface wave propagating member;

an input transducer for launching piezoelectric surface waves in said member;

an output transducer configuration comprising an electrode structure for sensing said piezoelectric surface waves, and a layer of material adjacent to said electrode structure having two resistance states dependent on the presence of a threshold electric filed;

voltage source means connected to said output transducer configuration for biasing it below a threshold value for switching states of said layer of material which taken together with the manifestation of the transient piezoelectric wave at said output transducer configuration provides a manifestation of the transient presence of said piezoelectric wave; and feedback path means between said output transducer and said input transducer including read-out circuitry and read-in circuitry for identifying the transient presence of said piezoelectric wave at said output transducer and for translating said identification to said input transducer for recirculating said piezoelectric pulse in said piezoelectric surface wave member.

14. Pulse scanner device comprising:

a piezoelectric surface wave device;

input transducer means for launching piezoelectric surface waves in said piezoelectric surface wave device including a pulse source means;

a plurality of sequentially spaced output electrode structures on said piezoelectric surface wave device for presenting a respective series of pulses representative of the transient presence of said piezoelectric surface waves at said output electrode structure, each said output electrode structure including a layer of material having two states dependent upon the threshold electric field therein;

voltage means for biasing said output structures stably below said threshold value of electric field for said layer of material for each said output transducer structure; and output means for presenting an indication of each said transient presence of said piezoelectric surface waves at the respective output electrode structure as a consequence of change of said states of said layer of material.

15. Coincidence selection device comprising:

first and second piezoelectric surface wave devices including respectively first and second input means for launching respectively piezoelectric surface waves in said piezoelectric devices;

first and second equal pluralities of output transducer configurations on said first and second piezoelectric surface wave devices, respectively, for providing indications of the transient presence of said respective piezoelectric surface waves thereat, each said output configuration including an electrode structure and a layer of material adjacent thereto having two states dependent upon the magnitude of the electric field therein, and biasing means for establishing a bias electric field in each said output electric structure stably below the threshold value for switching states of said layered material;

load matrix means connected to said first and second pluralities of electrode structures in coordinate relationship;

whereby timed selection of said output electrode structures selects a given load means from said selection matrix as a consequence of change of said states of the respective layers of materials adjacent to said electrode structures.

16. Coincidence selection device as set forth in claim 15 wherein X decoder means and Y decoder means are connected respectively to said matrix to identify the location of said given selected load means.

* * * * *